United States Patent
Bernstein et al.

(10) Patent No.: US 6,168,906 B1
(45) Date of Patent: Jan. 2, 2001

(54) MICROMACHINED MEMBRANE WITH LOCALLY COMPLIANT AND STIFF REGIONS AND METHOD OF MAKING SAME

(75) Inventors: Jonathan J. Bernstein, Medfield; Brian Thomas Cunningham, Stow, both of MA (US)

(73) Assignee: The Charles Stark Draper Laboratory, Inc., Cambridge, MA (US)

( * ) Notice: Under 35 U.S.C. 154(b), the term of this patent shall be extended for 0 days.

(21) Appl. No.: 09/084,508

(22) Filed: May 26, 1998

(51) Int. Cl.[7] ....................................... G03F 7/26
(52) U.S. Cl. ............................ 430/320; 430/324; 216/39
(58) Field of Search .................................. 430/320, 322, 430/323, 324, 314, 315; 216/2, 39

(56) References Cited

U.S. PATENT DOCUMENTS

| | | | |
|---|---|---|---|
| 4,241,165 | * 12/1980 | Hughes | 430/314 |
| 4,423,137 | * 12/1983 | Rester | 430/320 |
| 5,064,165 | * 11/1991 | Jerman | 251/61.1 |
| 5,165,283 | * 11/1992 | Kurtz et al. | 73/727 |
| 5,888,412 | * 3/1999 | Sooriakumar et al. | 430/320 |
| 5,899,746 | * 5/1999 | Mukai | 430/314 |

* cited by examiner

*Primary Examiner*—Kathleen Duda
(74) *Attorney, Agent, or Firm*—Landiorio & Teska

(57) ABSTRACT

A method of making a micromachined membrane having both stiff and flexible regions includes depositing a photoresist on a substrate; exposing the photoresist to actinic radiation through a mask to define openings having a first width in the photoresist in the stiff region and openings having a second width greater than the first width in the flexible region; developing the exposed photoresist to create the openings; etching the openings through the developed photoresist to create grooves in the substrate; and coating the substrate including the grooves with a film of material having a thickness greater than one half the first width and less than half of the second width to form adjacent contacting rigid corrugations in the stiff region and spaced compliant corrugations in the flexible region. Also disclosed is a micromachined membrane with a first region having as plurality of spaced nonintersecting corrugations being flexible in the direction transverse to the corrugations and a second region having a plurality of adjacent contacting intersecting corrugations being stiff in the plane of the intersecting corrugations and the direction transverse to the plane.

17 Claims, 10 Drawing Sheets

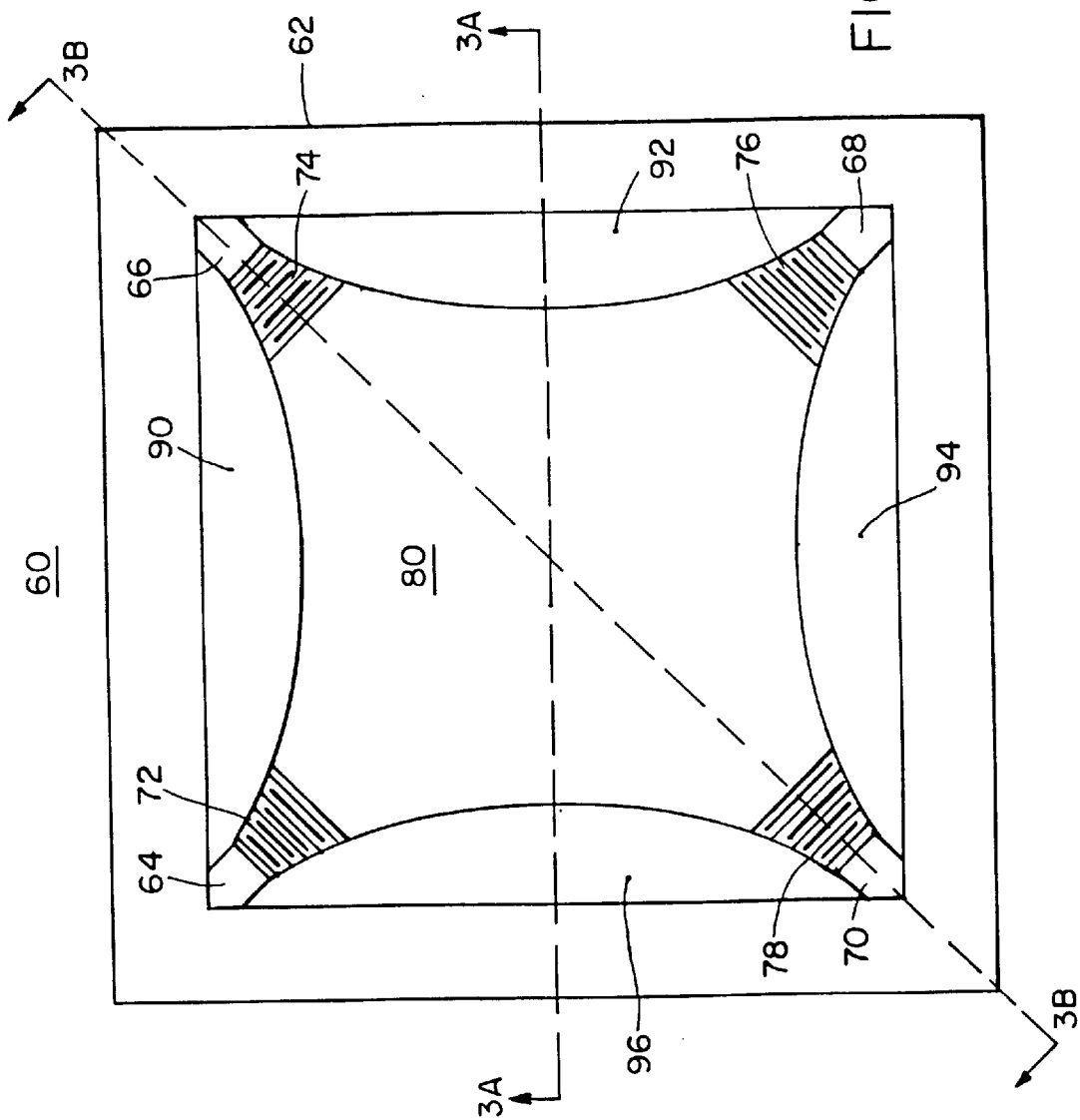

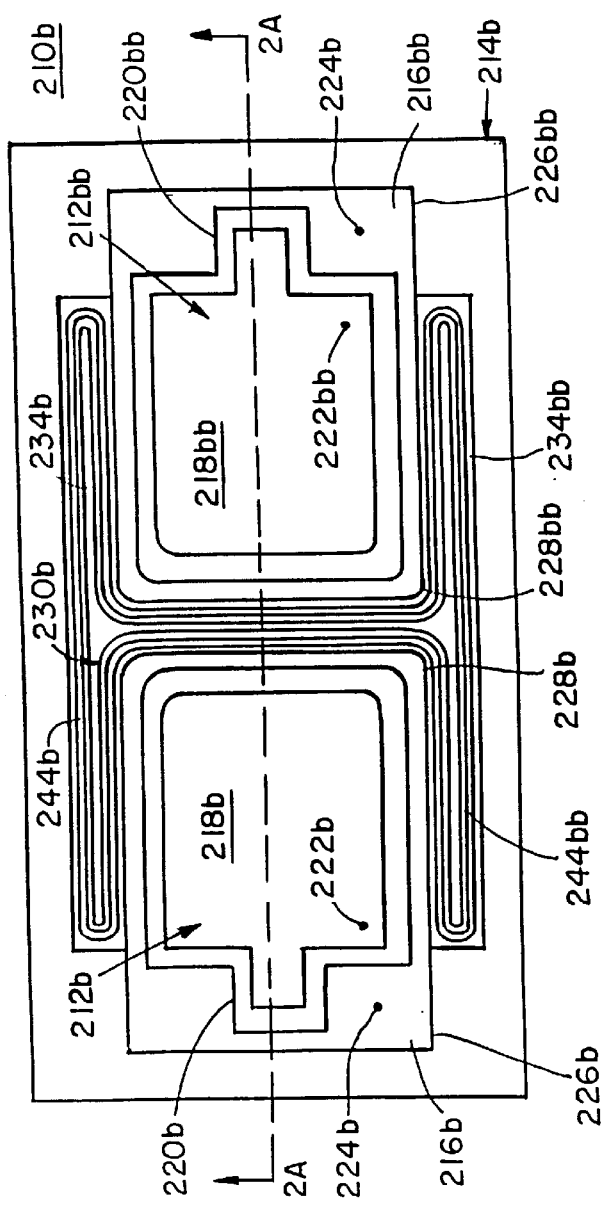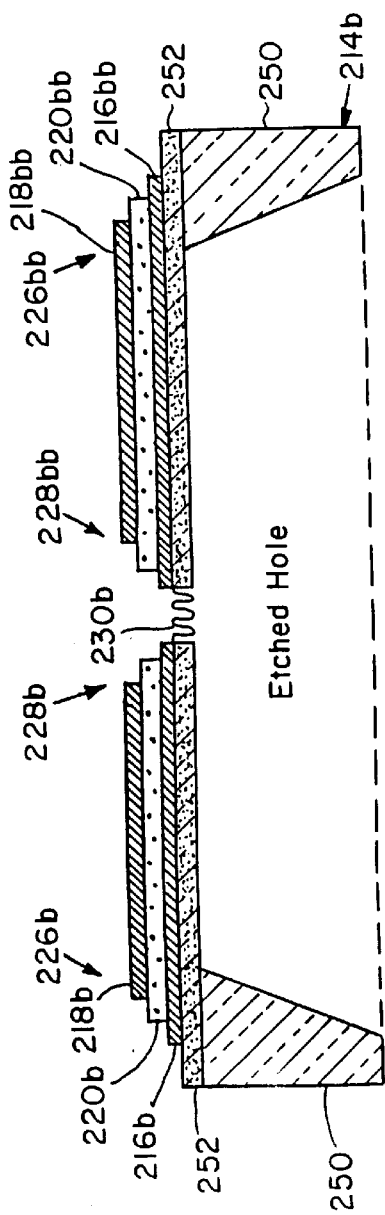

US 6,168,906 B1

MICROMACHINED MEMBRANE WITH LOCALLY COMPLIANT AND STIFF REGIONS AND METHOD OF MAKING SAME

FIELD OF INVENTION

This invention relates to a micromachined membrane with locally compliant and stiff regions and a method of making them.

BACKGROUND OF INVENTION

In the fabrication of micro-transducers, acoustic transducers, and micro-pumps, one often requires a flat plate of low mass which has high stiffness in certain areas to maintain flatness (the capacitor "sense" areas) and high flexibility in other areas (the "spring" areas). Low mass is required to avoid sharp resonant peaks and to extend usable bandwidth of the transducer. Former methods created thick regions where stiffness was desired, and used thin or corrugated sections where flexibility was desired. One disadvantage of former methods is that the thick regions used to gain stiffness add considerable mass to the transducer, and thereby decrease efficiency, bandwidth and increase undesirable inertial sensitivity. Furthermore, the creation of these thick regions requires additional processing steps which increase cost and complexity.

SUMMARY OF INVENTION

It is therefore an object of this invention to provide an improved micromachined membrane with locally compliant and stiff regions.

It is a further object of this invention to provide an improved method of making a micromachined membrane with locally compliant and stiff regions.

It is a further object of this invention to provide such a membrane which has a light weight stiff region and consequent improved bandwidth.

It is a further object of this invention to provide such a membrane which has improved sensitivity, dynamic range and linearity.

It is a further object of this invention to provide such a membrane which simultaneously creates stiff and flexible regions.

It is therefore an object of this invention to provide such a membrane which employs corrugations to create both the stiff and the flexible regions.

The invention results from the realization that truly effective corrugated membranes with both stiff and flexible regions can be made, for use in transducers, for example, by micromachining narrow and wide grooves in a substrate, then coating the grooves with a coating that is as thick or thicker than one half the width of the narrow grooves but less than half the width of the wide grooves to produce both stiff and flexible regions, and then removing the substrate from the coated grooves.

This invention features a method of making a micromachined membrane having both stiff and flexible regions. The method includes depositing a photoresist on a substrate; exposing the photoresist to actinic radiation through a mask to define openings having a first width in the photoresist in the stiff region and openings having a second width greater than that first width in the flexible region; and developing the exposed photoresist to create the openings. The openings are etched through the developed photoresist to create grooves in the substrate and the substrate including the grooves is coated with a film of material having a thickness greater than one half of the first width and less than half of the second width to form adjacent contacting rigid corrugations in the stiff region and spaced compliant corrugations in the flexible region.

In a preferred embodiment the photoresist may be phenyl formaldehyde or rubber. The actinic radiation may be ultraviolet radiation. The etching may be reactive ion etching. The coating may be silicon nitride or silicon carbide and may be from 0.1 to 1.0 microns thick. The first width may be equal to or less than 0.2 to 2.0 microns thick, and the second width may be greater than 0.2 to 2.0 microns. The method may further include removing the substrate from under the coating. Removing the substrate may include etching away the substrate with an anisotropic etch agent. The substrate may be silicon. The etch agent may be ethylene diamine pyrocatechol. The developed photoresists may be postbaked to round the edges of the openings and the postbaking may be for two to thirty minutes at 90–100° C.

The invention also features a micromachined membrane made by the method having a first region with a plurality of spaced nonintersecting corrugations being flexible in the direction transverse to the corrugations and a second region having a plurality of adjacent contacting intersecting corrugations being stiff in the plane of the intersecting corrugations in the direction transverse to the plane.

In a preferred embodiment the intersecting corrugations may form a honeycomb of squares or of hexagons, elongated hexagons or triangles.

DISCLOSURE OF PREFERRED EMBODIMENT

Other objects, features and advantages will occur to those skilled in the art from the following description of a preferred embodiment and the accompanying drawings, in which:

FIGS. 1A–F are schematic side elevational sectional views which depict the method of making a micromachined membrane having both stiff and flexible regions according to this invention;

FIGS. 2A–D are top plan schematic views of four different stiffening structures which can be made from the corrugations according to this method;

FIG. 3 is a top plan diagrammatic view of a micromachined microphone diaphragm using corrugations to create both stiff and flexible regions;

FIG. 6 is a diagrammatic top plan view of a piezoelectric transducer similar to that shown in FIG. 1 but with the corrugated membranes extending throughout the entire gap;

FIG. 6A is a sectional view taken along lines 6A—6A of FIG. 6;

Figure 1A:
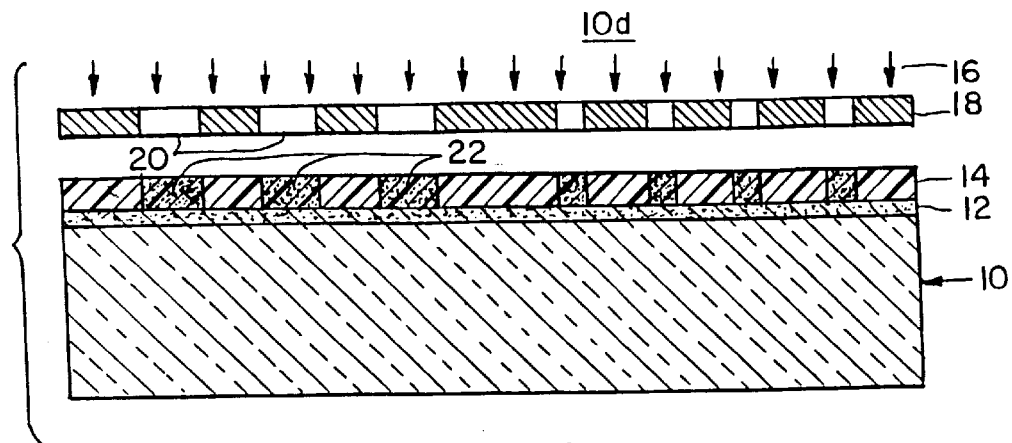
Figure 1B:
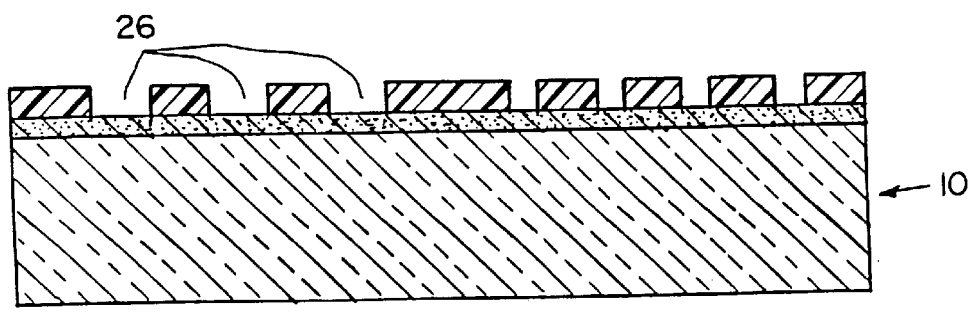
Figure 1C:
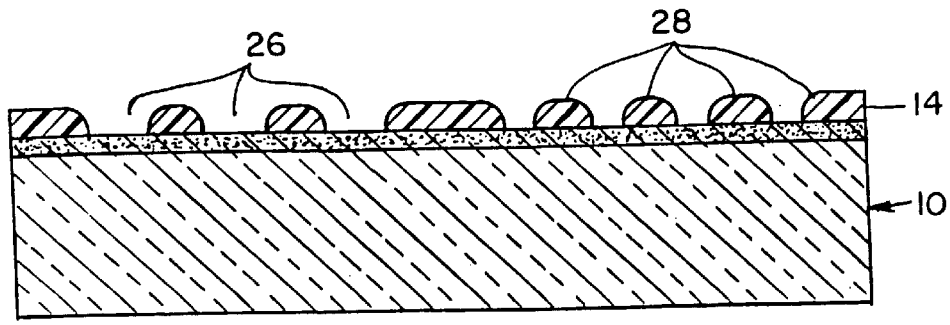
Figure 1D:
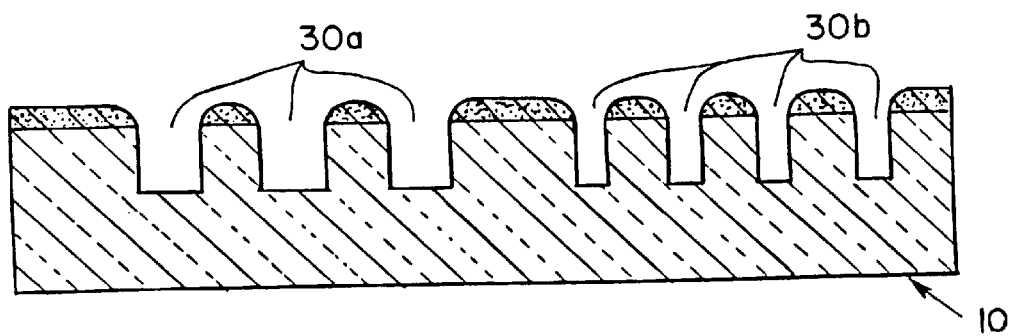
Figure 1E:
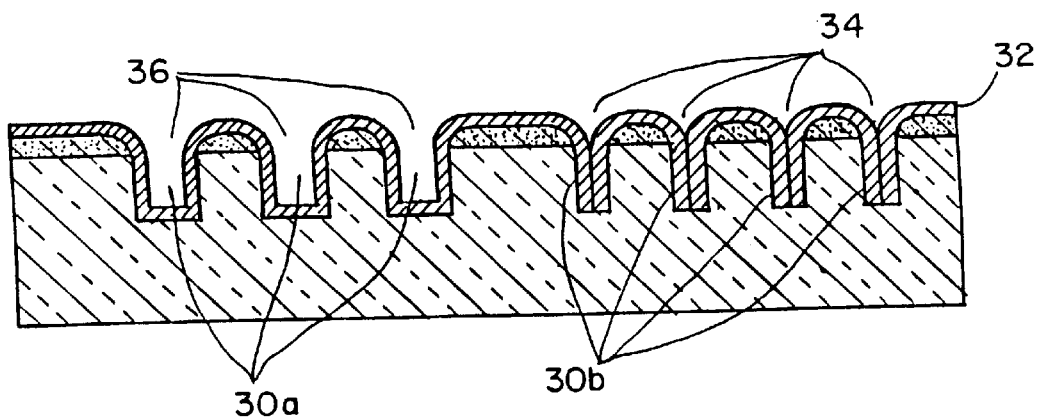
Figure 1F:
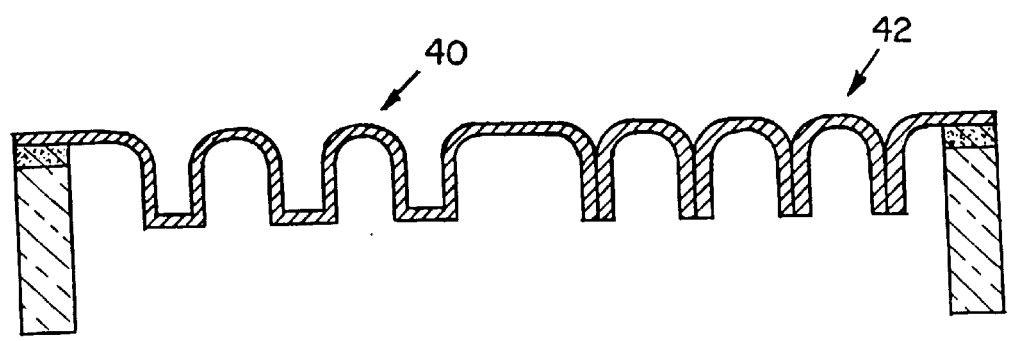

There is shown in FIG. 1 a starting substrate 10 which may be made of silicon. Disposed on substrate 10 is a layer 12 of $SiO_2$ to increase dielectric isolation and reduce capacitance at the edges of the diaphragm. A photoresist 14 such as phenyl formaldehyde (Novalac) for a positive operation or rubber for negative operations, is spun or otherwise deposited on the top of substrate 10. Prebaking is then effected at typically from two to thirty minutes at 90–100° C. in order to drive off solvents and other impurities. Then photoresist 14 is exposed to ultraviolet light 16 through a mask 18. Ultraviolet light 16 passes through holes 20 in mask 18, striking the photoresist 14 at corresponding portions 22. Substrate 10 is then subjected to a developer, FIG. 1B, so that the portions 22 are removed, leaving in their place grooves 26. A post bake may now be done for two to thirty minutes at 120–140° C. to round the edges as shown at 28 in FIG. 1C so that the ultimate corrugations will have a rounded configuration. Following this a reactive ion etch, FIG. 1D, is effected to create two sets of grooves 30a, 30b into the silicon substrate 10. The etching may be done in a vacuum of 0.1 to 10 millitorrs at a rate of 0.1 to $1.0\mu$ per minute. The grooves are formed so that the larger grooves 30a in the flexible section are at least twice the width of the narrower grooves 30b in the stiff section. Next, the grooves 30a and 30b are coated with a coating 32 such as silicon nitride or silicon carbide, FIG. 1E, to a thickness of 0.1 to $1\mu$. The grooves 30b should have a width which is less than twice the thickness of the coating. Grooves 30a should in comparison have a width which is greater in width than twice the thickness of coating 32. Thus for example, if a coating of $0.4\mu$ was deposited the narrow grooves 30b should have a width of $0.8\mu$ or less so that the coatings will contact as at 34 and form a unitary rigid body. Grooves 30a on the other hand should be greater in width than $0.8\mu$ so there will be substantial space 36 between them whereby the desired flexibility is attained. Typically the coating can be deposited by a chemical vapor deposition (CVD). Following this, as depicted in FIG. 1F, the second etch can be done to remove the silicon substrate from the corrugations which have been formed by the coating 32. The silicon etch can be either a wet chemical etch such as EDP (ethylene diamine pyrocatechol), KOH (potassium hydroxide), or TMAH (tetramethyl ammonium hydroxide); or a dry plasma etch such as a reactive ion etch. This dry etch may be ICP (Inductively Coupled Plasma), ECR (Electron-Cyclotron Resonance), or parallel plate RIE. This leaves a series of wide flexible corrugations 40 and narrow stiff corrugations 42 which actually contact each other.

Figure 3A:
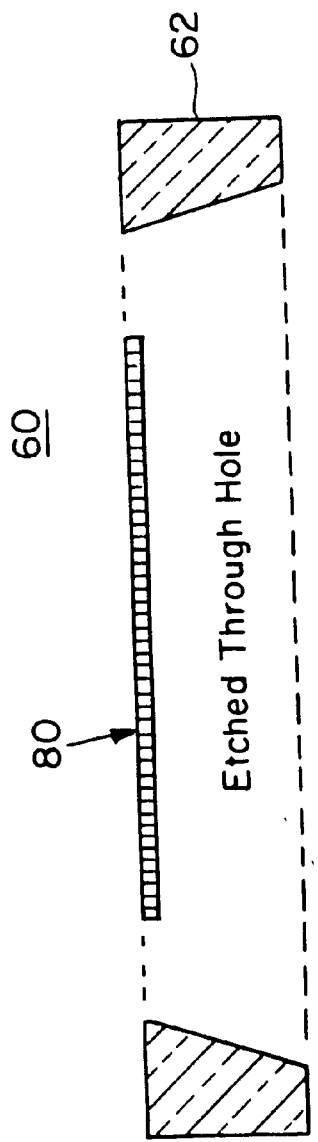
FIG. 3A is a sectional view taken along lines 3A—3A of FIG. 3.
Figure 3B:
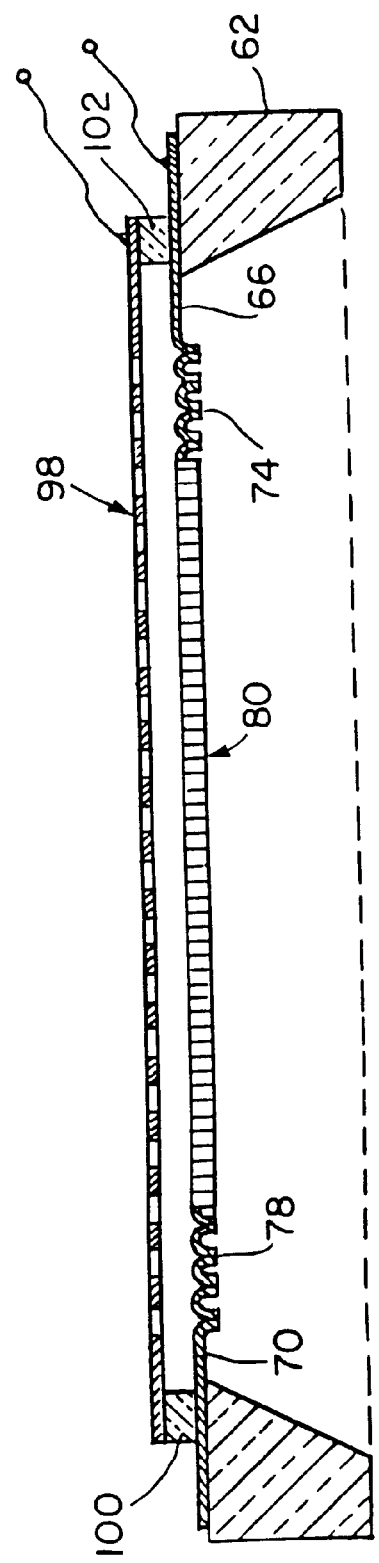
FIG. 3B is a sectional view similar to FIG. 3A taken along line 3B—3B of FIG. 3 in which a perforated backplane has been added to the diaphragm of FIG. 3B to create a microphone.

Although thus far the explanation of the corrugations has used an example of one dimensional corrugations, this is not a necessary limitation of the invention, as two-dimensional corrugations may be used to improve the rigidity of the stiff corrugated regions. As shown in FIGS. 2A–D, by way of illustration and not limitation, various types of honeycomb constructions can be effected using this technique, such as hexagonal honeycomb structure 50, FIG. 2A, square honeycomb 52, FIG. 2B, elongated hexagonal honeycomb 54, FIG. 2C, and triangular honeycomb 56, FIG. 2D. A typical device such as a microphone diaphragm 60, FIGS. 3 and 3A, which can be made with this device includes typically substrate 62 which supports four mounts 64, 66, 68 and 70 from which are suspended corrugations 72, 74, 76, 78 that support the stiffened corrugations of membrane 80, and the flexible corrugations 72, 74, 76 and 78 both made by the same method according to this invention. Stiffened region 80 is completely separated from substrate 62 by gaps 90, 92, 94 and 96 and is only supported by the flexible corrugations 72, 74, 76 and 78. A typical use of diaphragm 60 can be in making a microphone by adding a perforated backplane 98, FIG. 3B, mounted on dielectric isolators 100, 102.

Figure 4:
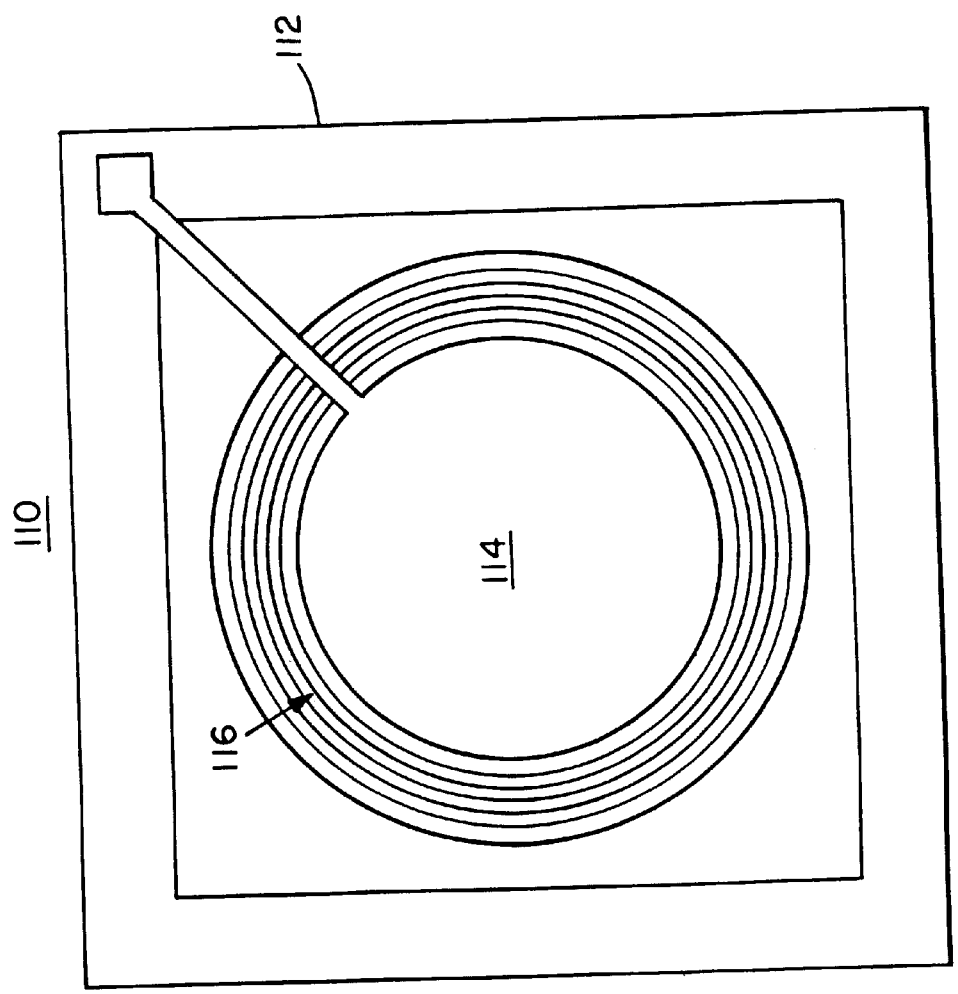
FIG. 4 is a top plan schematic view of a micromachined membrane according to this invention with circular corrugations.

Another diaphragm which may be made according to the method of this invention is shown in FIG. 4, where diaphragm 110 includes a silicon substrate 112 on which is mounted a stiffened or rigid area 114 flexibly mounted through circumferential corrugations 116 to substrate 112.

Other examples of devices that can be made according to this invention are shown in FIGS. 5–8A.

Figure 5:
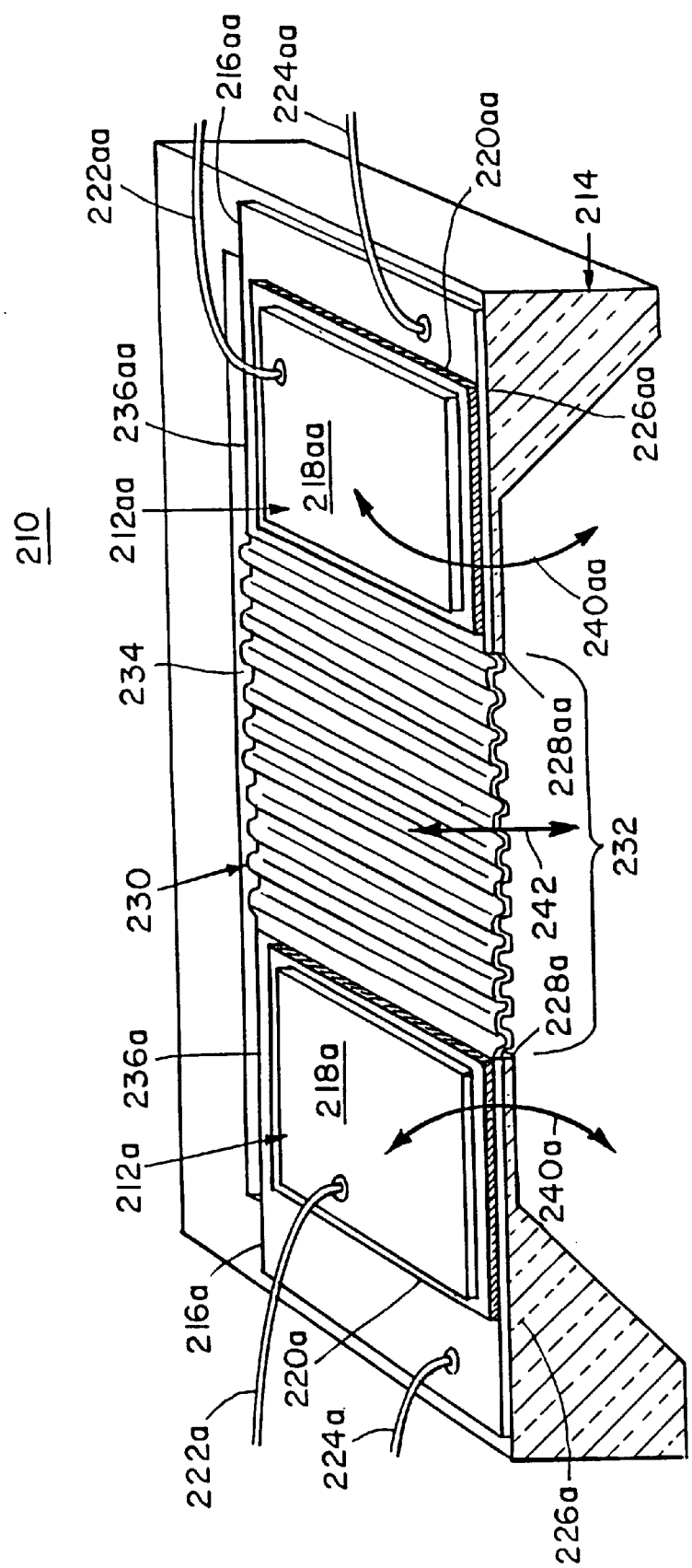
FIG. 5 is a three-dimensional sectional view of a micromachined piezoelectric transducer according to this invention with an open gap.

There is shown in FIG. 5 a micromachined piezoelectric transducer 210 according to this invention which includes two actuator means 212a and 212aa mounted on substrate 214. Each actuator includes a bottom conductor 216a, 216aa and a top conductor 218a, 218aa with a piezoelectric element 220a, 220aa between them. Electrical leads 222a, 222aa, 224a and 224aa are wire bonded to their respective conductors. The proximal ends 226a, 226aa are mounted on substrate 214 while the distal edges 228a, 228aa are interconnected with corrugated diaphragm or membrane 230 that extends between them in slot, window or gap 232. A portion 234 of gap 232 extends along the remaining distal edges 236a and 236aa of actuator means 212a and 212aa but there is no corrugated membrane in slot, window or gap portion 234. When electrical power is applied to leads 222a, 222aa, 224a and 224aa, actuator means 212a and 212aa move in the direction indicated by arrows 240a and 240aa, and are permitted to do so because of the flexibility of corrugated membrane 230 which can move in the direction of arrow 242. Conversely, if a pressure wave or acoustic wave or elastic wave occurs to move actuator means 212a and 212aa in the direction of arrow 240a and 240aa, a voltage is generated across the respective leads 222a, 224a and 222a, 224aa.

One of the benefits of the use of corrugated membrane 230 is that it preserves the flexibility of movement of actuator means 212a and 212aa while closing the gap which would allow pressure leakage or bleeding from one side of the transducer to the other. The full benefit of this can be achieved in an embodiment such as FIG. 6 where transducer 210b is shown with the corrugated membranes 230 extending not just in the portion between the distal ends 228b, 228b of actuator means 212b and 212bb, but also in the side portions 234b, 234bb where there are corrugated membranes 244b and 244bb. The construction of transducer 210b can be seen in more detail in sectional view FIG. 6A where substrate 214 is depicted as including a silicon base 250 with a boron doped silicon layer 252 on top.

Figure 7A:
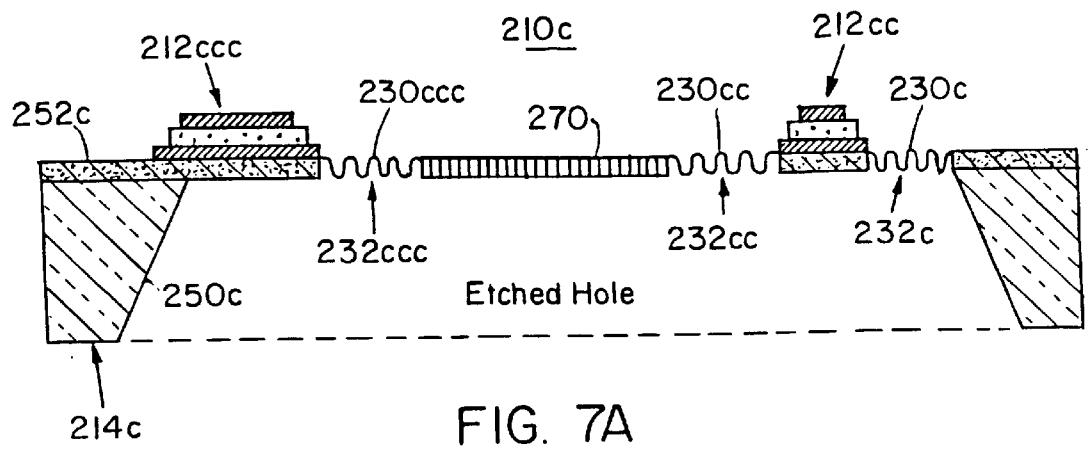
FIG. 7A is a sectional view taken along lines 7A—7A of FIG. 7.
Figure 2A:
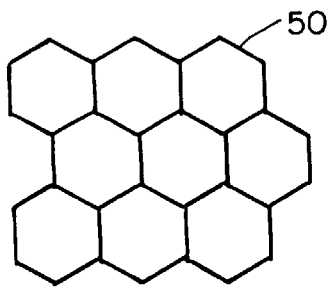
Figure 2B:
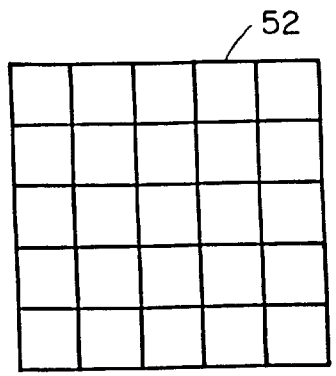
Figure 2C:
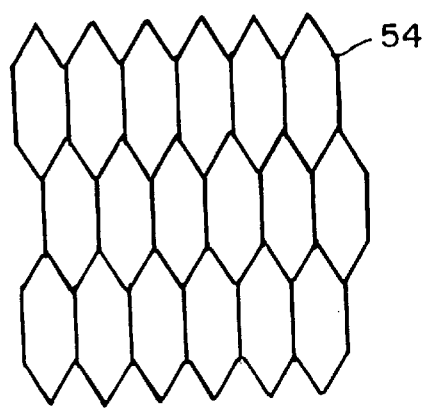
Figure 2D:
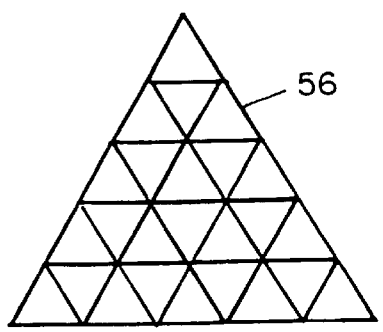
Figure 7:
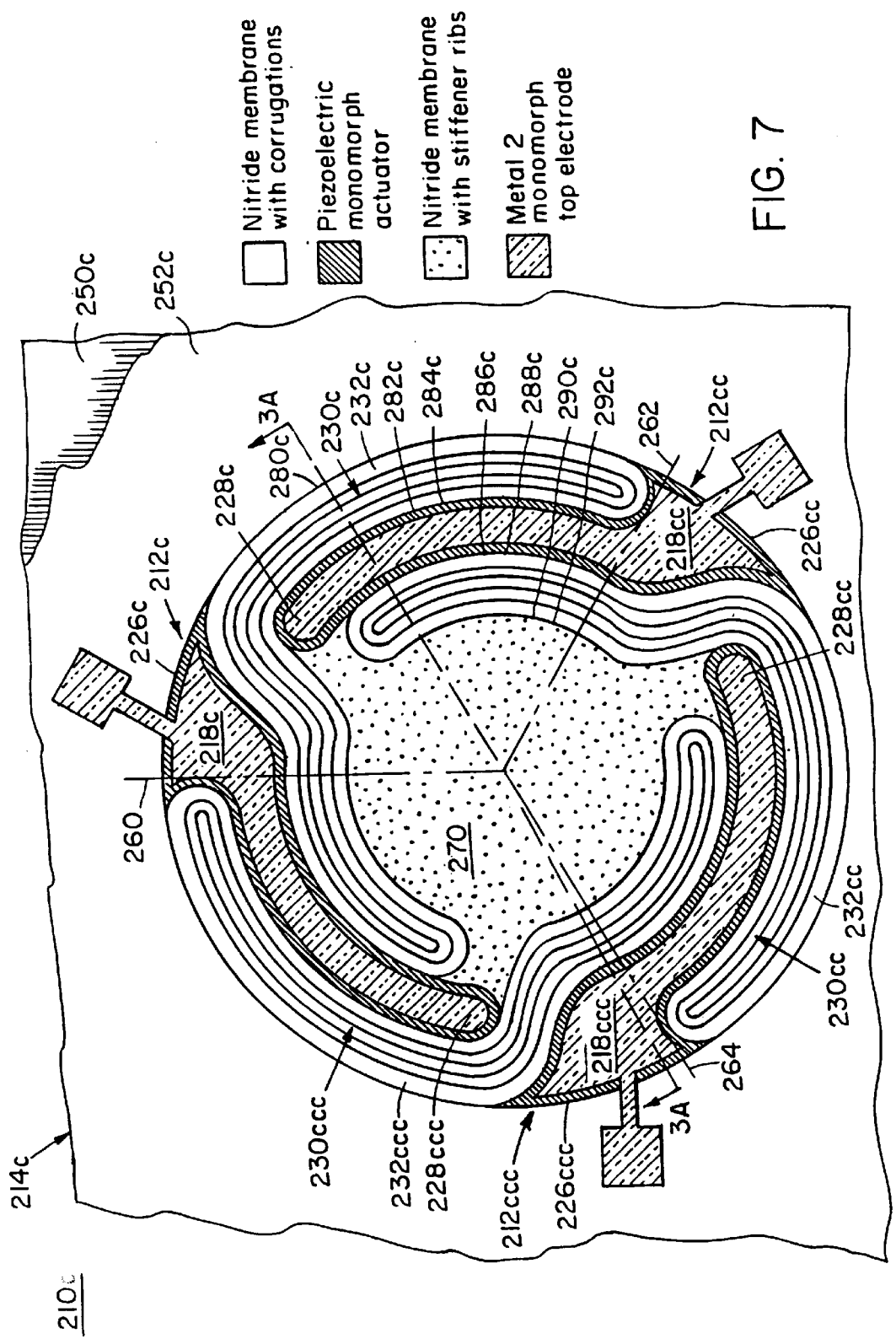
FIG. 7 is a top plan view of another piezoelectric transducer according to this invention which is rotationally symmetrical and uses three transducers and a stiff piston.

In another construction transducer 210c, FIG. 7, is mounted on substrate 214c which includes silicon base 250c and boron doped silicon layer 252c. There are three actuator means 212c, 212cc, 212ccc arranged in threefold rotational symmetry as indicated by symmetry lines 260, 262 and 264. Each of actuator means 212c, 212cc, 212ccc has its proximal end 226c, 226cc, 226ccc mounted to substrate 214c and then extends generally arcuately and terminates at its distal 228c, 228cc, 228ccc where it is attached to stiff piston section 270. There are three sets of corrugated membranes 230c, 230cc, 230ccc, each of which extends across the associated gap 232c, 232cc, 232ccc. For example, corrugated membrane 230c has its outer edge 280c interconnected with substrate 214c and its inner edge 282c connected with the outer edge 284c of actuator means 212cc. The inner edge 286c of actuator means 212cc interconnects with the outer edge 288c of corrugated membrane 232cc and the inner edge 290c of corrugated membrane 232cc engages with a portion of the edge 292c of stiff piston region 270. In this way, when an electric voltage is applied across actuators 212c, 212cc and 212ccc their distal ends 228c, 228cc, 228ccc will bend upward or downward into the plane of the paper or out of it moving stiff region 270 with them. Or, conversely, when stiff region 270 is moved into or out of the plane of the paper it will move the distal ends 228c, 228cc, 228ccc of actuator means 212c, 212cc, 212ccc and create a voltage across the actuator. The construction of transducer 210c, FIG. 7, can be seen in greater detail in FIG. 7A.

Figure 8:
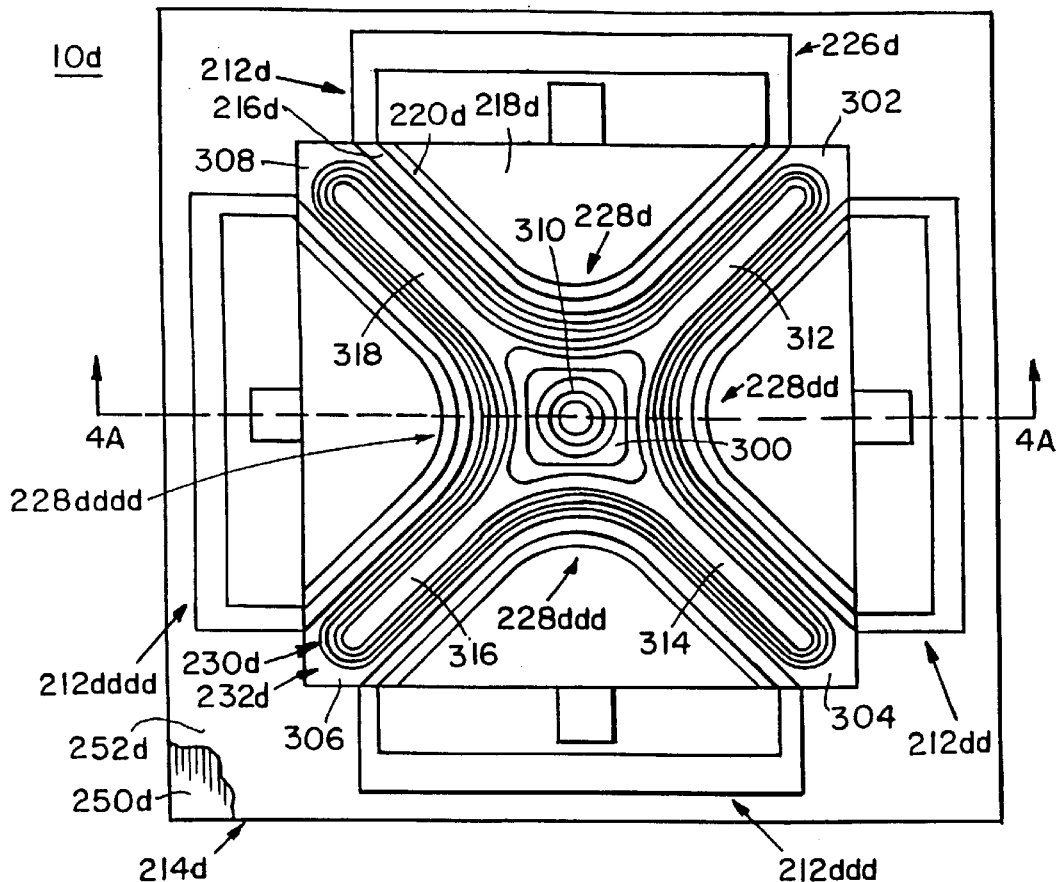
FIG. 8 is a diagrammatic top plan view of a piezoelectric transducer according to this invention having fourfold symmetry.
Figure 8A:
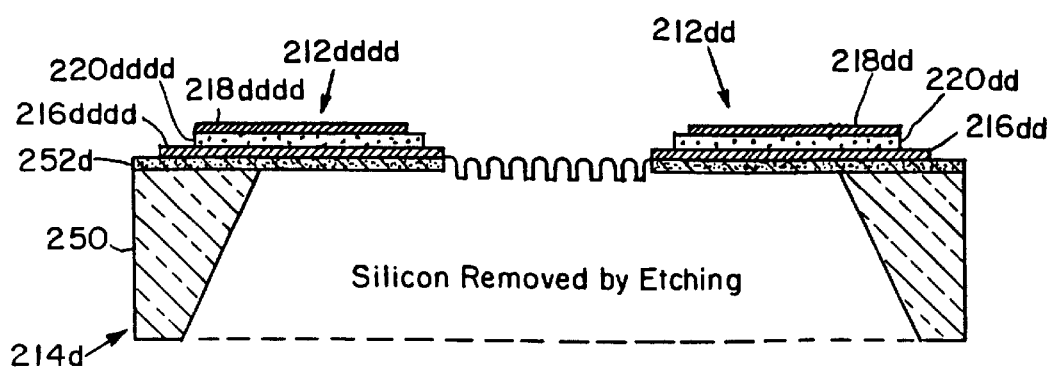
FIG. 8A is a sectional view taken along line 8A—8A of FIG. 8.

In another construction, FIGS. 8, 8A, a fourfold symmetrical transducer 10d includes four actuator means 212d, 212dd, 212ddd, 212dddd with a corrugated membrane 230d that is disposed in gap 232d. Gap 32d has a center portion 300 and four arms 302, 304, 306 and 308 in which are located a center portion 310 and four legs 312, 314, 316 and 318 of corrugated membrane 230d. When the distal ends 228d, 228dd, 228ddd and 228dddd are driven into or out of the plane of the paper either by the application of a voltage potential across the actuator means or by an elastic or an acoustic wave, those distal ends are free to move because of the flexibility of the corrugated membrane.

The actuators herein have been referred to as having piezoelectric layers, but this is not a necessary limitation as the phrase piezoelectric herein is used to include not just piezoelectric materials but the similar ferroelectric and electrostrictive materials that perform the same function. Any one of the embodiments in FIGS. 5–8A may be made with a ferroelectric, electrostrictive or piezoelectric material to the same end. Furthermore, the particular construction can be either a monomorph or a bimorph as will be understood by those skilled in the art. It should also be understood that while in the particular embodiment shown the corrugated membranes run generally parallel to the edges of the actuator means, this is not a necessary limitation of the invention as they may be transverse to those edges or even perpendicular to them.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A method of making a micromachined membrane having both stiff and flexible regions, comprising:

depositing a photoresist on a substrate;

exposing the photoresist to actinic radiation through a mask to define openings having a first width in the photoresist in the stiff region and openings having a second width greater than the first width in the flexible region;

developing the exposed photoresist to create the openings;

etching the openings through the developed photoresist to create grooves in the substrate; and coating the substrate including the grooves with a film of material having a thickness greater than one half of said first width and less than half of said second width to form adjacent, contacting rigid corrugations in said stiff region and spaced, compliant corrugations in said flexible region.

2. The method of claim 1 in which said photoresist is a positive resist including phenylformaldehyde.

3. The method of claim 1 in which said photoresist is a negative resist including rubber.

4. The method of claim 1 in which said actinic radiation is ultraviolet radiation.

5. The method of claim 1 in which the etching is reactive ion etching.

6. The method of claim 1 in which the coating is silicon nitride.

7. The method of claim 1 in which the coating is silicon carbide.

8. The method of claim 1 in which the coating is 0.1–1.0 $\mu$m thick.

9. The method of claim 8 in which said first width is between 0.2 and 2.0 $\mu$m.

10. The method of claim 8 in which said second width is between 0.2 and 8.0 $\mu$m.

11. The method of claim 1 further including removing the substrate from under the coating.

12. The method of claim 11 in which removing the substrate includes etching away the substrate with an anisotropic etch agent.

13. The method of claim 11 in which removing the substrate includes etching away the substrate with a dry plasma etch.

14. The method of claim 11 in which the substrate is silicon.

15. The method of claim 14 in which removing the substrate includes etching away the substrate with ethylene diamine pyrocatechol.

16. The method of claim 1 in which the developed photoresist is postbaked to round the edges of the openings.

17. The method of claim 1 in which the postbaking is for 2–30 minutes at 90–100° C.

* * * * *